United States Patent [19]
Fukui et al.

[11] Patent Number: 5,657,533
[45] Date of Patent: Aug. 19, 1997

[54] ELECTRONIC PARTS MOUNTING DEVICE

[75] Inventors: Eiji Fukui; Katsuhiko Taguchi, both of Tokyo, Japan

[73] Assignee: Juki Corporation, Tokyo, Japan

[21] Appl. No.: 599,662

[22] Filed: Feb. 9, 1996

Related U.S. Application Data

[63] Continuation of Ser. No. 183,022, Jan. 18, 1994, abandoned.

[30] Foreign Application Priority Data

Jan. 19, 1993 [JP] Japan ................... 5-023761

[51] Int. Cl.$^6$ ............... B23P 19/00; B25J 15/06
[52] U.S. Cl. ................. 29/740; 29/743; 294/2; 294/64.1
[58] Field of Search ............. 29/740, 743, 741, 29/739; 901/36, 40; 294/64, 1, 2

[56] References Cited

U.S. PATENT DOCUMENTS

| | | | |
|---|---|---|---|
| 4,135,630 | 1/1979 | Snyder et al. | |
| 4,753,004 | 6/1988 | Fujioka | 29/740 |
| 4,759,124 | 7/1988 | Snyder et al. | 29/743 X |
| 4,858,974 | 8/1989 | Stannek | 29/743 X |
| 4,860,438 | 8/1989 | Chen | 29/740 |
| 4,950,011 | 8/1990 | Borcea et al. | 29/743 X |
| 5,195,235 | 3/1993 | Mifuji | 29/743 X |

FOREIGN PATENT DOCUMENTS

| | | |
|---|---|---|
| 51-036684 | 3/1976 | Japan. |
| 52-020666 | 2/1977 | Japan. |
| 4-199599 | 7/1992 | Japan. |

*Primary Examiner*—S. Thomas Hughes
*Attorney, Agent, or Firm*—Morgan & Finnegan, L.L.P.

[57] ABSTRACT

An electronic parts mounting device of the type including a head movable along the upper surface of a substrate and in the directions of X- and Y-axes for, arranging electronic parts at predetermined locations on the substrate. The device comprises a frame, a spindle mounted on the frame rotatably and movably in the vertical directions with the upper end being connected to the vacuum source and the lower end having a nozzle for absorbing the electronic parts, a rotatable device rotatable relative to the frame and connected to the spindle displaceably in the axial directions and not rotatably relative thereto. A locator supporting device for supporting at least one pair of locators with the lower ends of which opposing the tip end of the nozzle and for clamping and retaining the electronic parts absorbed on the nozzle, and the locators supported rotatably around the horizontal axis and connected to the spindle so as to displace in the axial direction and non-rotatably, and connected to the rotatable device, and a locator rotating device for rotating the locators to close the locators when the locators and the nozzle are at the same level.

3 Claims, 8 Drawing Sheets

ELECTRONIC PARTS MOUNTING DEVICE

This is a continuation of application Ser. No. 08/183,022, filed on Jan. 18, 1994, now abandoned.

BACKGROUND OF THE INVENTION

1. Technical Field

This invention relates to an electronic parts mounting device such as a chip mounter and the like.

2. Prior Art

A chip mounter is publicly known for locating and mounting electronic parts such as a diode, a register, an LSI and the like on a printed circuit board and the like. FIG. 7 is a schematic view of a typical prior art chip mounter. In the drawing, shown at numeral 2 is a tape reel for storing electronic parts. The electronic parts are usually mounted and stored on a surface of the tape which is usually formed of a paper or a plastic material, and the tape is usually wound on a tape reel. A parts supply unit 4 is provided near to the tape reel 2, for retaining the tape reel 2 and supplying the electronic parts being stored on the tape by feeding out the tape sequentially and intermittently at a distance at which the electronic parts has been mounted on the tape. Further, there are provided on the chip mounter conveyer means including such as a belt conveyer for carrying in such as a printed circuit board (substrate) 6 to a predetermined location and carrying out the substrate 6 when electronic parts have been mounted thereon.

There are provided parts-absorption-mounting head device 10 for mounting electronic parts on the substrate 6 being located standstill at a predetermined position. Usually, 60–80 sets of parts supply units 4 are provided for mounting a plurality of various electronic parts on a single substrate 6. The parts-absorption-mounting head device 10 is mounted on an X-Y drive mechanism 12 which includes an X transfer arm 12a movable in the X-direction and a Y transfer arm 12b movable in the Y-direction.

The parts-absorption-mounting head device 10 receives electronic parts from the parts supply unit 4 by vacuum absorption, controls the attitude of the absorbed parts to the center of a nozzle, and mounts the parts on the substrate 6. Such device is disclosed in, e.g., Japanese Patent Publication No. 3-15359 (1991) (U.S. Pat. No. 4,135,630) and the like, and FIG. 8 shows a schematic view. Two pairs of locators 14 are mounted on a rotatable hollow spindle 16, and the pairs of the locators 14 (only one pair is shown in the drawing) can open and close with respect to the axis of the spindle 16 and in the directions orthogonally intersecting with each other, such that when the locators are closed the attitude of the parts 18 absorbed and retained on the tip end of the spindle 16 is corrected. The two pairs of the locators 14 are fixed in one direction with respect to the rotation of the spindle 16, and each locator 14 is urged in the closing direction by independent spring not shown in the drawing, and the attitude of the parts 18 is corrected when the locators are moved in the closing directions. Further, there are provided a casing 20 which covers the spindle 16, and a cam 22 being slidable in the vertical directions with respect to the casing 20. When the cam 22 is moved downward by a cam driving means not shown in the drawing, the lower end of the cam 22 contacts with the upper ends of the locators 14 to move them in radially outward directions.

However, in such prior art devices, there are the following problems. First, the two pairs of the locators 14 are fixed in one direction with respect to the rotation of the spindle 16 (the locators 14 do not rotate when the spindle 16 is rotated), thus, in mounting a parts on the substrate 6 at an angle of 30 degrees, for example, it is required to rotate the spindle by the desired angle of 30 degrees after the parts is located by the locator 14, thus, there is a tendency that the located angle is displaced. It will be noted that in mounting the parts at an angle either of 0 degree, 90 degrees, 180 degrees and 270 degrees, it is not required to rotate the spindle after the parts is located by the locator 14.

Second, each locator 14 is urged in the closing direction by an independent spring (not shown), thus, when the spring force of respective springs are not equal with each other, the parts 18 is displaced in the lateral direction, as shown in FIG. 9. Accordingly, the parts 18 cannot be located at the center of the nozzle. In particular, the spring force of the respective springs cannot be adjusted equally even though the springs are formed of coil springs or leaf springs, and it is not possible to overcome the time-dependent change, thus, even if the spring force of respective springs are adjusted equal at the initial condition, the parts will be dislocated gradually as time goes by.

Further, the chip mounter is usually mounted, on a single substrate 6, electronic parts of several tens to several hundreds, and the substrate 6 consists of at least several sheet and at the most of several hundreds or several thousands sheet, thus, it is important to reduce the time for absorbing and mounting the parts. Therefore, it is important to reduce the minimum weight of the head device 10, and to increase the maximum displacing speed of the device 10. However, the device for opening/closing the locator 14 tends to increase the weight and to reduce the displacing speed.

Further, in the prior art device, a parts-absorbing step, an upward-moving step for the spindle 16, an engaging (position adjusting) step for the locator 14, an opening step for the locator 14, a downward-moving step for the spindle 16 and a parts-mounting step are performed sequentially, which increases inevitably the cycle time.

The present invention aims to solve the above described problems in the prior art device, and to provide an electronic parts mounting device not causing dislocation of the parts and reducing largely the mounting time.

SUMMARY OF THE INVENTION

According to the invention, there is provided an electronic parts mounting device of the type including a head movable along the upper surface of a substrate and in the directions of X-axis and Y-axis for arranging electronic parts at predetermined locations on the substrate, in which, the device comprises a frame of the head, a spindle being mounted on the frame rotatably and movably in the vertical directions with the upper end being connected to the source of vacuum and the lower end having a nozzle for absorbing the electronic parts, rotatable means being arranged around the circumference of the spindle and rotatable relative to the frame and being connected to the spindle displaceably in the axial directions and not rotatably relative thereto, a locator supporting means for supporting at least one pair of locators with the lower ends of which opposing the tip end of the nozzle and being able to clamp and retain the electronic parts absorbed by the nozzle, and the locators being supported rotatably around the horizontal axis and being connected to the spindle displaceably in the axial direction and non-rotatably, and being connected to the rotatable means displaceably in the vertical directions, and a locator rotating means provided on the locator supporting means for rotating the locators so as to close the locators when the locators and the nozzle are at the same level.

According to another feature of the invention, there is provided an electronic parts mounting device of the type including a head movable along the upper surface of a substrate and in the directions of X-axis and Y-axis for arranging electronic parts at predetermined locations on the substrate, in which, the device comprises a frame of the head, a spindle being mounted on the frame rotatably and movably in the vertical directions with the upper end being connected to the source of vacuum and the lower end having a nozzle for absorbing the electronic parts, a locator supporting means for supporting at least one pair of locators with the lower ends of which opposing the tip end of the nozzle and being able to clamp and retain the electronic parts absorbed by the nozzle, and the locators being supported rotatably around the horizontal axis and being connected to the spindle displaceably in the axial direction, and being connected to the frame displaceably in the vertical directions, connecting means acting on the locator supporting means to follow the upward movement of the spindle until the lower ends of the nozzle and the locators are located at the same level, rollers being provided at the upper ends of the locators and being rotatable around the axis parallel to the rotating axis of the locators, and a guide arranged in the radial directions of the spindle to engage with the rollers such that when the locator supporting means are moved upward the locators are rotated around the rotating axis.

According to a further feature of the invention, there is provided an electronic parts mounting device of the type including a head movable along the upper surface of a substrate and in the directions of X-axis and Y-axis for arranging electronic parts at predetermined locations on the substrate, in which, the device comprises a frame of the head, a spindle being mounted on the frame rotatably and movably in the vertical directions with the upper end being connected to the source of vacuum and the lower end having a nozzle for absorbing the electronic parts, rotating means being arranged around the spindle, rotatable relative to the frame, and connected to the spindle displaceably in the axial direction and non-rotatably, a locator supporting means for supporting at least one pair of locators with the lower ends of which opposing the tip end of the nozzle and being able to clamp and retain the electronic parts absorbed by the nozzle, and the locators being supported rotatably around the horizontal axis and being connected to the spindle displaceably in the axial direction, connecting means acting on the locator supporting means to follow the upward movement of the spindle until the lower ends of the nozzle and the locators are located at the same level, rollers being provided at the upper ends of the locators and being rotatable around the axis parallel to the rotating axis of the locators, and a guide arranged in the radial directions of the spindle to engage with the rollers such that when the locator supporting means are moved upward the locators are rotated around the rotating axis.

ADVANTAGES OF THE INVENTION

According to the invention, the spindle is moved in vertical directions by vertical driving means at the condition being rotatably retained by the spindle retaining member. The spindle is retained on a rotary retaining member which permits axial movement of the spindle and restricts the direction of the rotation of the spindle, and the rotary retaining member is rotated by a rotary driving means. First spring members act to open the locators, and second spring members act to close the locators. When the spindle is moved in the vertical directions, the locator retaining members follow the movement and move in the vertical directions, thus, the locators pivotally supported thereon are automatically opened and closed by guide members which are arranged respectively at points of force application. The spindle rotates together with the locators with the electronic parts being absorbed thereon through a desired angle.

According to the invention, following advantages can be attained.

The locators are opened and closed by the force displacing the spindle in the vertical directions, thus, it is possible to omit actuators for opening/closing the locators in prior art devices.

It is possible to reduce the weight, thus, to increase the operation speed. Further, the opening/closing of the locators or the locating operation of the parts is performed in response to the upward/downward movement of the spindle, thus, it is possible to minimize the parts locating time, and to increase actuating speed.

The locators rotate together with the spindle, thus, it is possible to prevent the dislocation of the parts even though the parts are located at an angle. Further, it is possible to perform simultaneously the positional location and the angular location, thus, high operation speed can be attained.

Further, a single spring acts on a pair of locators to urge them in the closing directions, thus, even though the spring force changes due to the elapsed time, the parts receive the same force in diametrically opposite directions, and the parts can be located at the axis of the spindle.

BRIEF DESCRIPTION OF THE DRAWINGS

Further objects and advantages of the invention will become apparent from the following descriptions in conjunction with attached drawings in which.

DETAILED DESCRIPTION OF PREFERRED EMBODIMENTS

Figure 1:
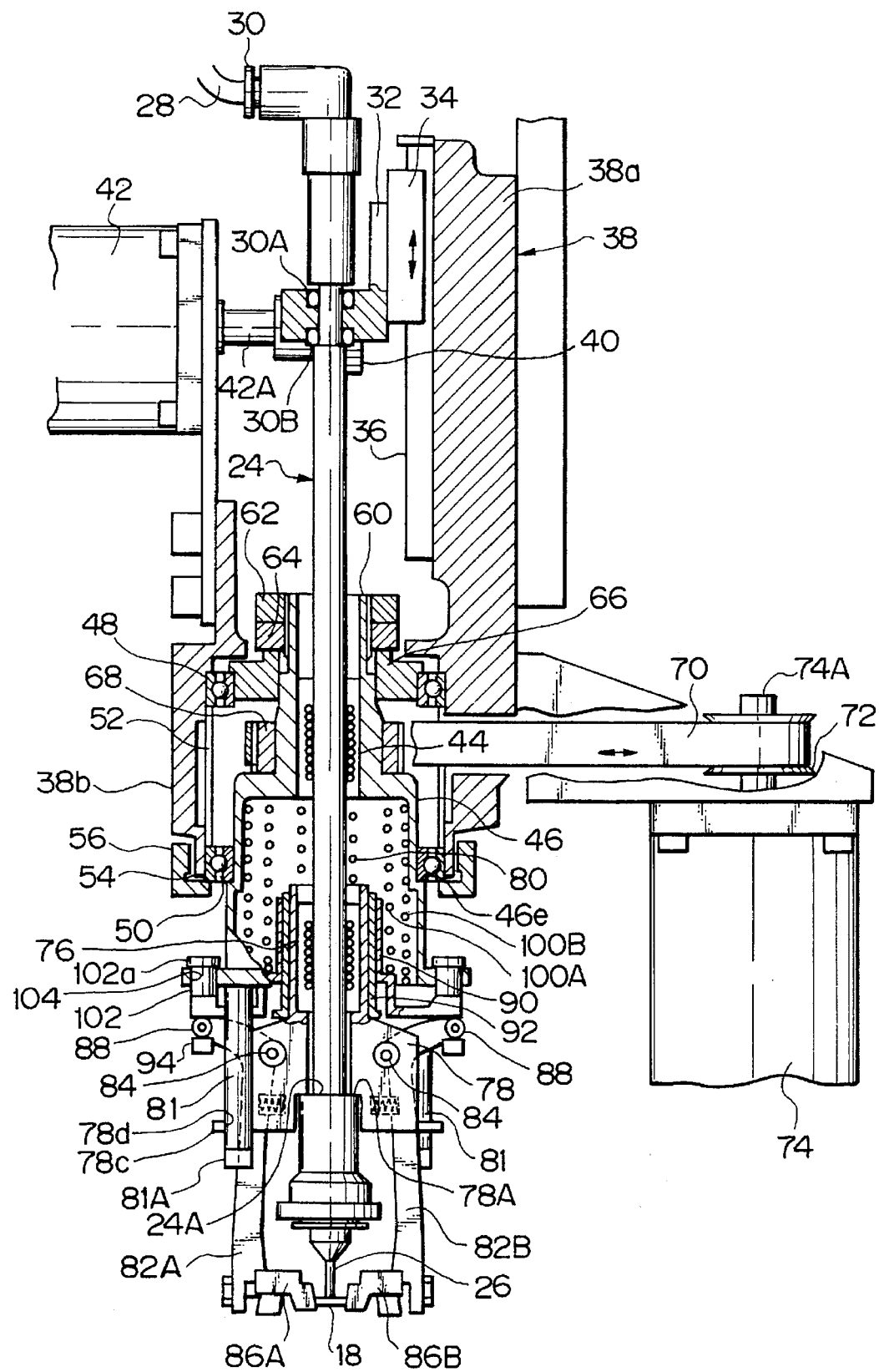
FIG. 1 is a schematic sectional view of a parts absorbing-mounting device according to a preferred embodiment of the invention.
Figure 2:
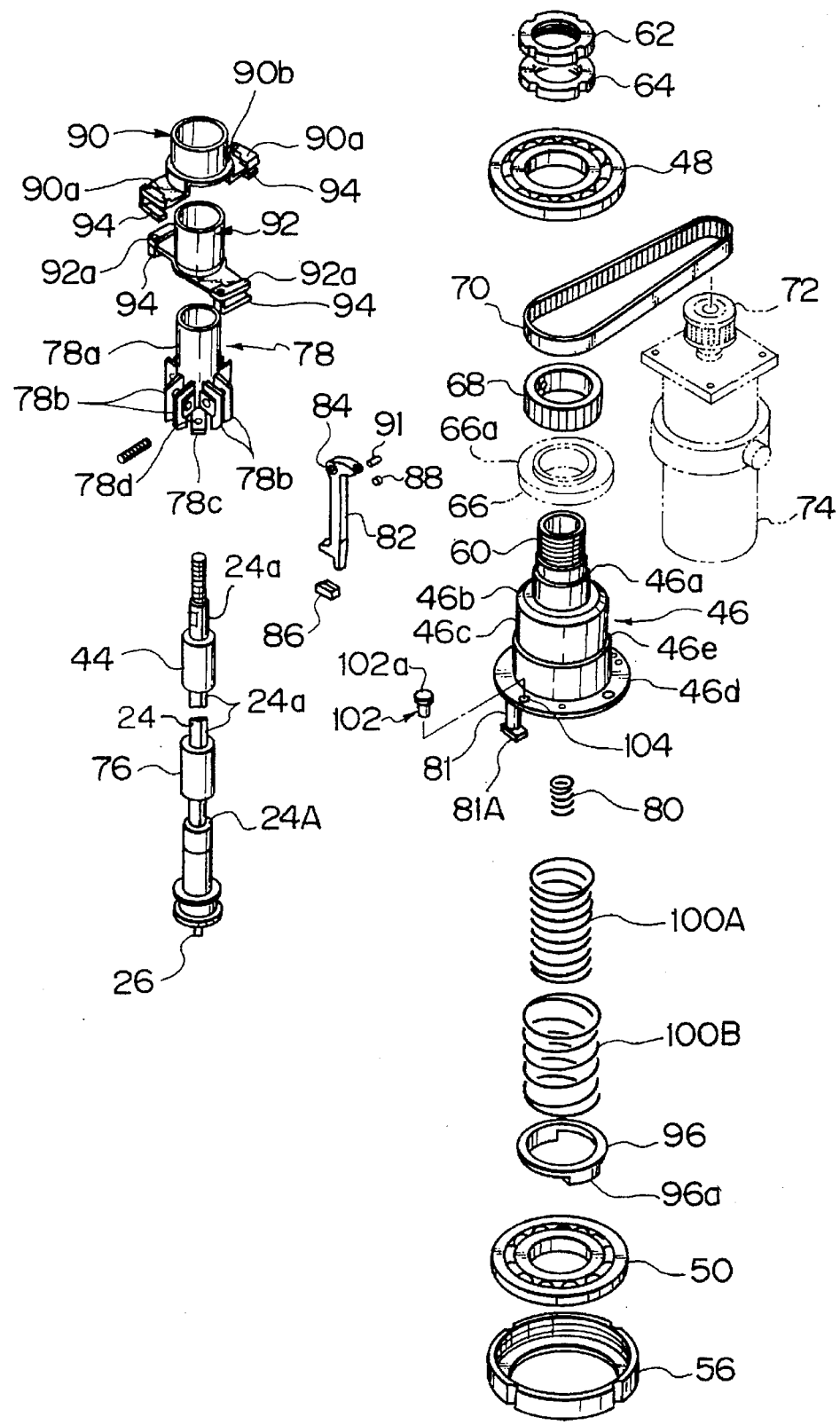
FIG. 2 is a perspective exploded view of essential members constituting the device of FIG. 1.

FIG. 1 shows a vertical sectional view of a parts absorbing-mounting device according to a preferred embodiment of the present invention, FIG. 2 shows a perspective exploded view of the device of FIG. 1, and FIG. 3 through FIG. 5 are views showing the operation of the device of FIG. 1.

Figure 6:
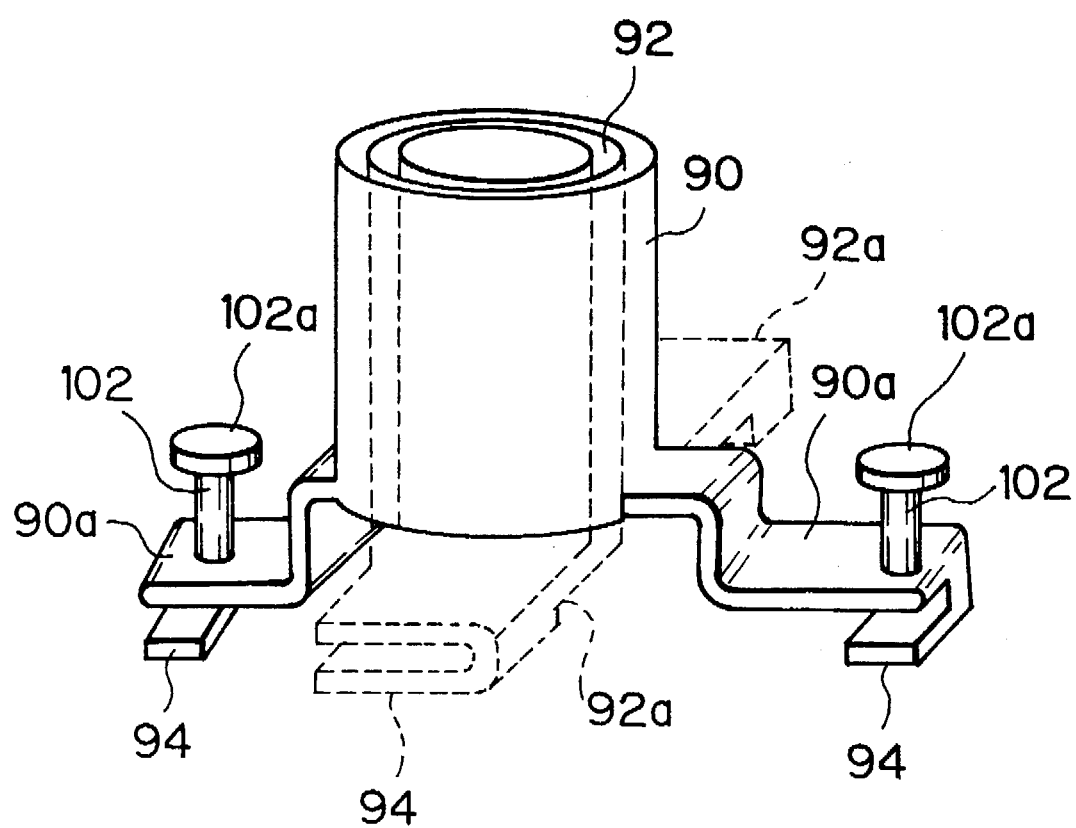
FIG. 6 is an enlarged perspective view of a portion of the device of FIG. 1.

The device shown in the drawings is mounted on a chip mounter such as shown in FIG. 6. In FIG. 1, shown at numeral 18 are parts such as an electronic parts to be mounted on a substrate, and at least one of the parts 18 is absorbed by the head device and is mounted on the substrate. The device comprises a hollow spindle 24 having, on the lower end a nozzle 26 for vacuum-absorbing the parts 18 and, on the upper end a joint 30 for connected to an air tube 28 being communicated with a source of vacuum pressure. The upper portion of the spindle 24 is rotatably retained by a spindle retaining member 32 through two bearings 30A and 30B.

The spindle retaining member 32 is mounted on a linear movement guide 34, and the guide 34 is displaceable in the vertical upward and downward directions along a rail 36 which is provided on a frame 38. There are provided on the retaining member 32 racks not shown in the drawings along the range of the vertical movement of the nozzle 26, and the racks engage with a pinion gear 40 being secured to a rotating shaft 42A of a drive motor 42 which is referred as vertical drive means. Thus, the spindle 24 can be moved in the vertical directions at a rotatable condition.

The frame 38 comprises an upper portion 38a being formed to constitute a rail 36 and a lower portion 38b of the shape of a cylinder. The lower end portion of the cylindrical lower portion 38b is formed to have a thin thickness and screw thread portion 54 is formed on the outer circumference. While, the spindle 24 has, on the lengthwise middle portion, the shape of a spline having axially extending grooves 24a. A first ball-spline nut 44 engages with the spline of the spindle 24, and the nut 44 is secured to a rotation retaining member 46 also referred to as a rotation retain. Since the spindle 24 and the rotation retaining member 46 are connected through the first ball-spline nut 44, they can relatively move in the axial direction of the spindle 24, but they cannot move in the rotational direction relatively.

In the cylindrical portion 38b of the frame 38, bearings 48 and 50 are fitted, and the axial location of these bearings 48 and 50 is retained by the upper and lower ends of a cylindrical support member 52. There are formed openings in the support member 52 for passing therethrough a timing belt 70 which will be described later.

The rotation retaining member 46 has a screw-thread portion 60 on the upper outer circumferential portion, a cylindrical portion 46a and a stepped portion 46b on the intermediate portion, a large diameter cylindrical portion 46c and a stepped portion 46e in the outer circumference of the portion 46c on the lower end portion, and a flange portion 46d on the lower end. A subsidiary member 66 is fitted on the intermediate cylindrical portion 46a of the rotation retaining member 46, and the upper end of the subsidiary member 66 engages with the upper end of the upper bearing 48. The lower bearing 50 is fitted on the large diameter cylindrical portion 46c of the rotation retaining member 46, and engages with the stepped portion 46e. The bearing 50 is retained nuts 62 and 64 engaging with the screw-thread portion 60 of the rotation retaining member 46. Thus, the member 46 and the subsidiary member 66 are rotatably supported on the frame 38 through the bearings 48 and 50.

A timing pulley 68 is fitted on and secured to the cylindrical portion 46a of the rotation retaining member 46.

While, a motor 74 acting as rotary drive means is fixed to the frame, and a timing pulley 72 is secured to a rotary shaft 74A of the motor 74. A timing belt 70 extends between the timing pulleys 68 and 72. The spindle 24 and the rotation retaining member 46 are connected through the spline nut 44, thus, the rotation of the motor 74 is transmitted simultaneously to the rotation retaining member 46 and the spindle 24.

A locator retaining member 78, also referred to as a locator retainer, is connected to the spindle 24. The locator retaining member 78 has an upper cylindrical portion 78a engaging with a spline nut 76, the constitution of which being similar to that of the spline nut 44, and the locator retaining member 78 is connected to the spindle 24 through the spline nut 76. There are formed, on the lower portion of the locator retaining member 78, four pairs of circumferentially equally spaced and radially projecting retaining portions 78b and one pair of radially opposing and plate-like supporting portion 78c.

A first spring (coil spring) 80 is interposed between the locator retaining member 78 and the rotation retaining member 46 and is wound around the spindle 24. The locator retaining member 78 is urged downward by the first spring, so that a shoulder portion 78A formed on the inner circumference of the lower end of the locator retaining member 78 engages with engaging stepped portion 24A of the spindle 24. When the spindle 24 is moved upward by the rotation of the motor 42, due to the engagement between the stepped portion 24A and the shoulder portion 78A, the locator retaining member 78 follows the movement, namely, moves upward compressing the first spring member 80.

The supporting portions 78c provided on the lower end of the locator retaining member 78 are formed to have guide openings 78d. A pair of guide rods 81 provided on the lower end of the rotation retaining member 46 to extend downward therefrom are loosely fitted through the guide openings 78d respectively. A sidewise projecting stop 81A is provided on each guide rod 81 and is engageable with the supporting portion 78c. The guide rods 81 are arranged symmetrically with respect to the vertical axis of the rotation retaining member 46. When the spindle 24 moves downward, the locator retaining member 78 moves downward, due to the spring force of the first spring member 80, together with the spindle 24. The downward movement of the locator retaining member 78 is restricted when the stop 81A engages with the supporting portion 78c, and the stepped portion 24A separates from the shoulder portion 78A. The downward movement of the locator retaining member 78 is stopped, but the spindle 24 continues the downward movement. The vertical movement of the locator retaining member 78 is guided by the guide rods 81.

There are provided cylindrical sliding members 90 and 92, also referred to as vertical movement members, having different diameters and in sliding and radially overlapping relationship. One pairs of radially projecting flange portions 90a and 92a are respectively formed on the sliding members 90 and 92. The flange portions 90a and the flange portions 92a are arranged orthogonally with respect to each other, and are fitted respectively with the cylindrical portion 78a of the locator retaining member 78 independently. The cylindrical sliding members 90 and 92 are independently urged downward by a pair of second spring member (coil spring) 100A and 100B, also referred to as elastic means, which are arranged between the upper end of the cylindrical portion 46c of the rotation retaining member 46 and flange portions 90a and 92a of the cylindrical sliding members 90 and 92 respectively. The lower end of the inner spring 100A engages with a stepped portion 90b formed on the outer cylindrical sliding member 90. A member 96 is fitted on the outer cylindrical sliding member 90, and the lower end of the outer spring 100B engages with the upper end of the member 96, and urges downward the flange portion 92a of the inner cylindrical sliding member 92 through a projecting portion 96a of the member 96.

The four pairs of the retaining portions 78b of the locator retaining member 78 are respectively fitted with locators 82, and the locators 82 are supported rotatably around horizontal axial lines at upper end fulcrum portions 84. Pawl portions 86 are fixedly provided on the lower ends of respective locators 82, and the upper ends support rotatably around axes 91 being parallel to the horizontal axis respectively rollers 88. The locators 82A and 82B opposing with respect to the axis of the locator retaining member 78 act as a pair such that pawl portions 86A and 86B on the tip ends open and close to clamp and release the chip parts 18 in response to the above described rotation.

Guide portions 94 of generally U-shaped section are formed on the lower tip end portion of the flange portions 90a and 92a of the cylindrical sliding members 90 and 92 respectively, and the rollers 88 of respective locators 82 are fitted in the guide portions 94 such that the rollers 88 rotate within the guide portions 94 when the locators 82 rotate. The rollers 88 act as fulcrum portions when the pawl portions 86A and 86B clamp the parts 18.

There are provided rods 102 with the lower ends of which being secured to respective flange portions 90a of the outer cylindrical sliding member 90. The rods 102 have flange portions 102a on the upper ends, and intermediate portions vertically movably fitted with openings 104 in flange portions 46d of the rotation retaining member 46.

When the cylindrical sliding member 90 is displaced downward by the spring force of the second spring members 100A and 100B, the upper end projecting portions 102a of the rods 102 contact with the flange portion 46d of the rotation retaining member 46 to act as stops, thus the further movement of the member 90 is prevented. On the contrary, when the pawl portions 86A and 86B clamp the parts 18, the rollers 88 are moved upward relative to the fulcrum portions 84, thus the cylindrical sliding member 90 moves upward against the spring force of the second spring members 100A and 100B. Incidentally, there are provided members acting similarly and correspondingly to the locators 82A and 82B and having similar constitution, with the fulcrum portions 84 and 84, pawl portions 86A and 86B, roller portions 88 and 88, cylindrical sliding member 90, second spring members 100A and 100B, and rods 102 and 102, at the direction orthogonal to the locators 82A and 82B.

The operation of the device will now be explained.

Figure 3:
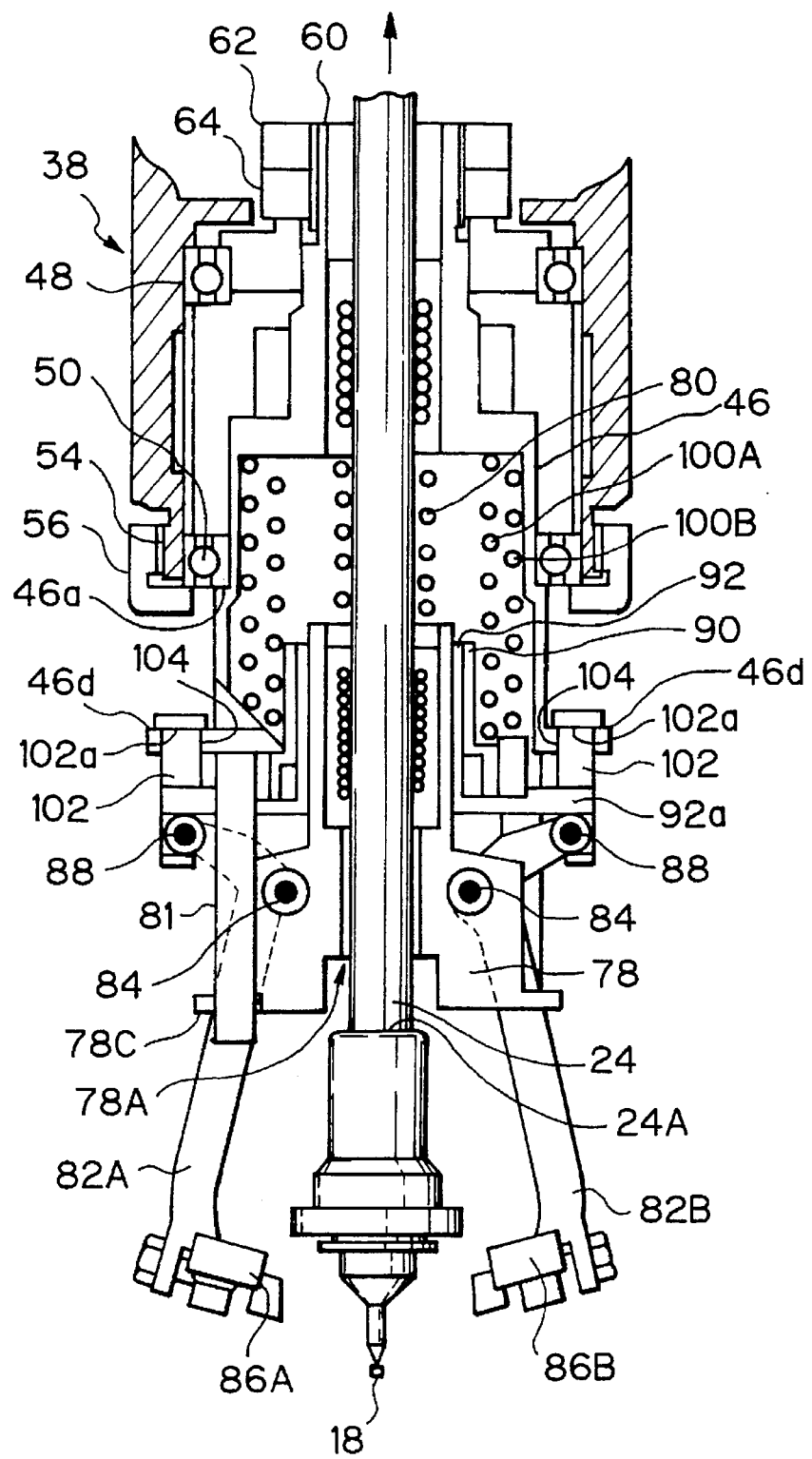
FIG. 3 is an enlarged sectional view of a portion of the device of FIG. 1.
Figure 4:
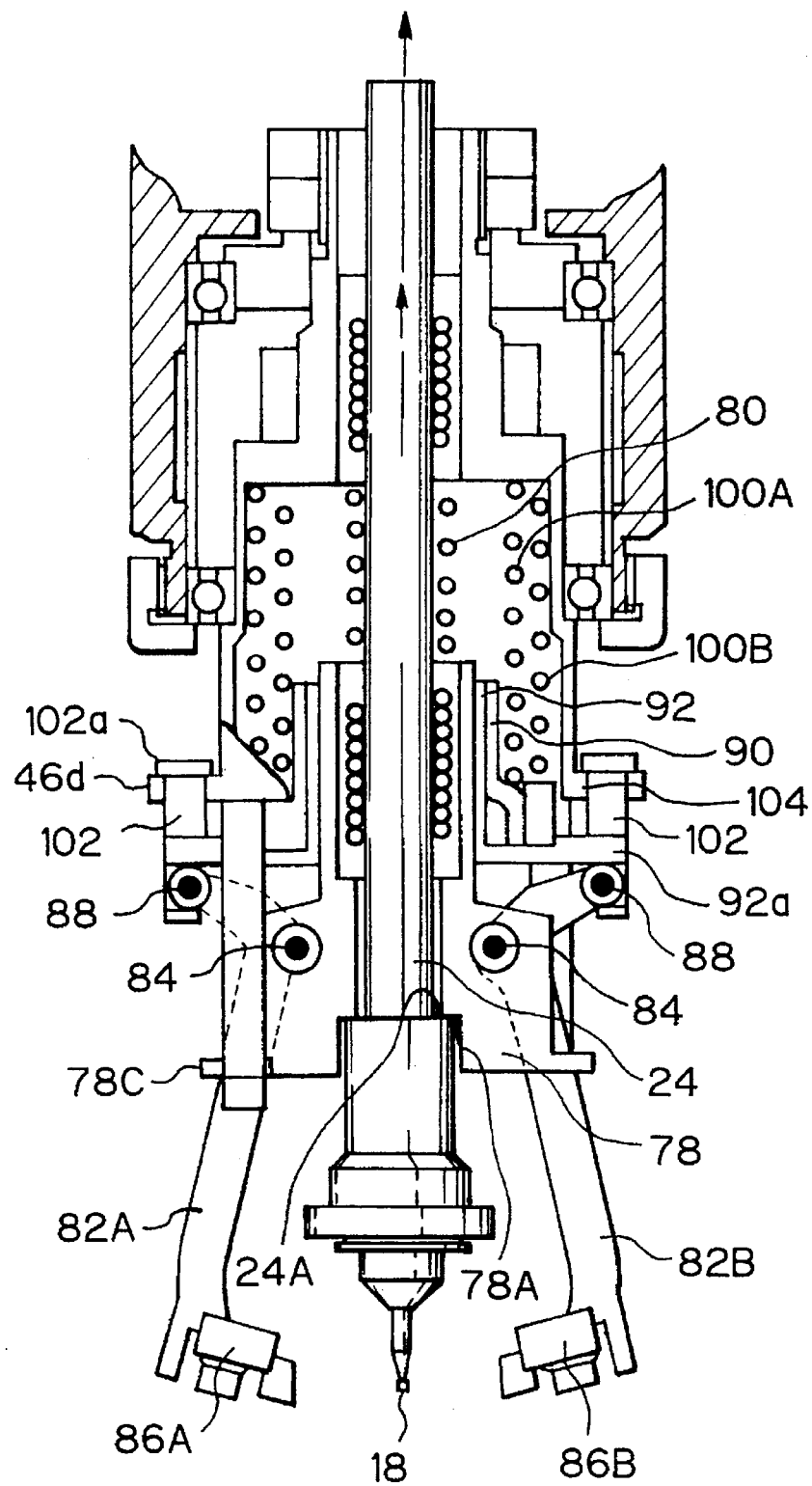
FIG. 4 is a view similar to FIG. 3 but showing another operational condition.
Figure 5:
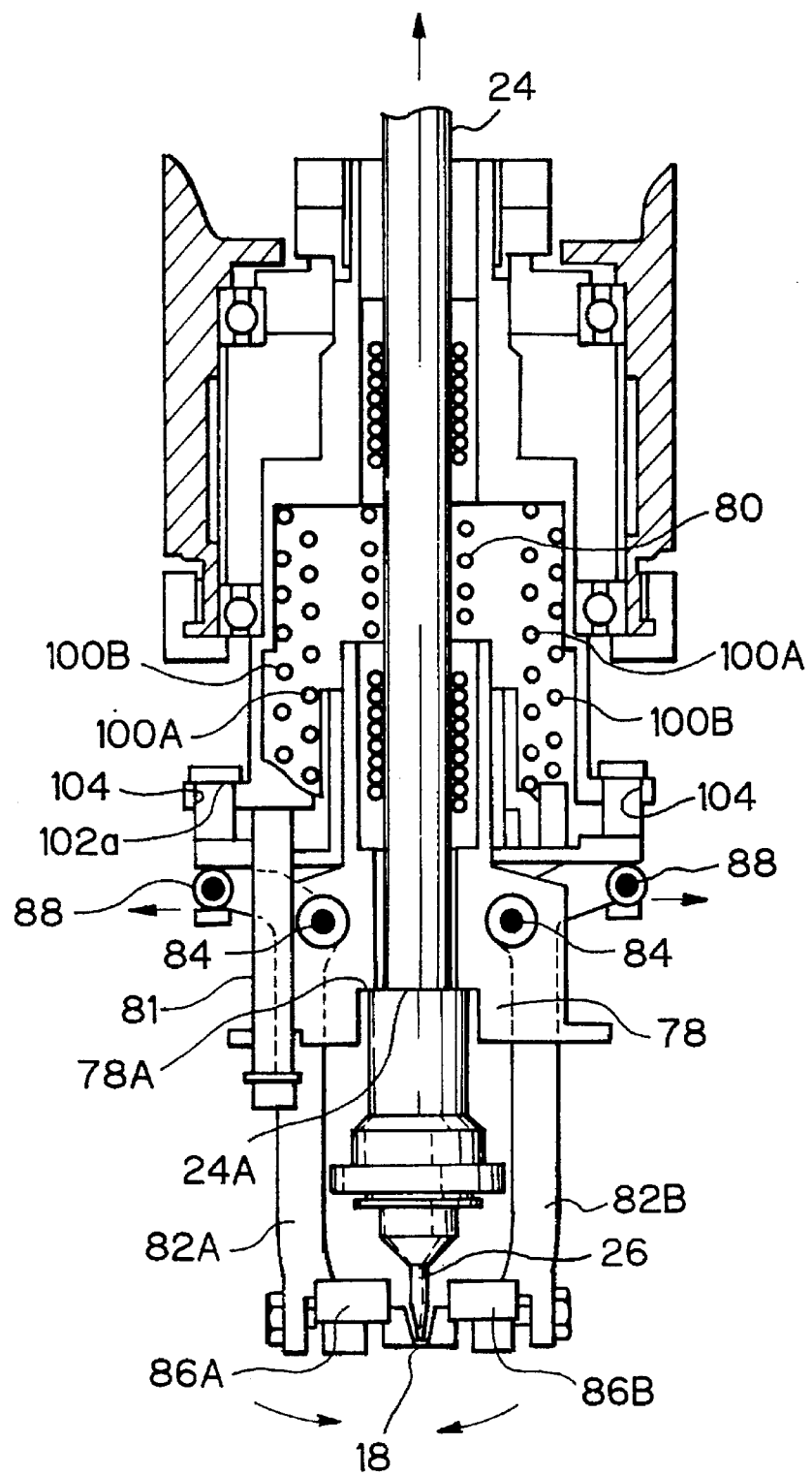
FIG. 5 is a view similar to FIG. 3 but showing a further operational condition.

FIG. 3 through FIG. 5 show the sequence in which, the device absorbs electronic parts 18 and adjust the position thereof, and the description is made with respect to a pair of locators 82A and 82B, for example.

Figure 7:
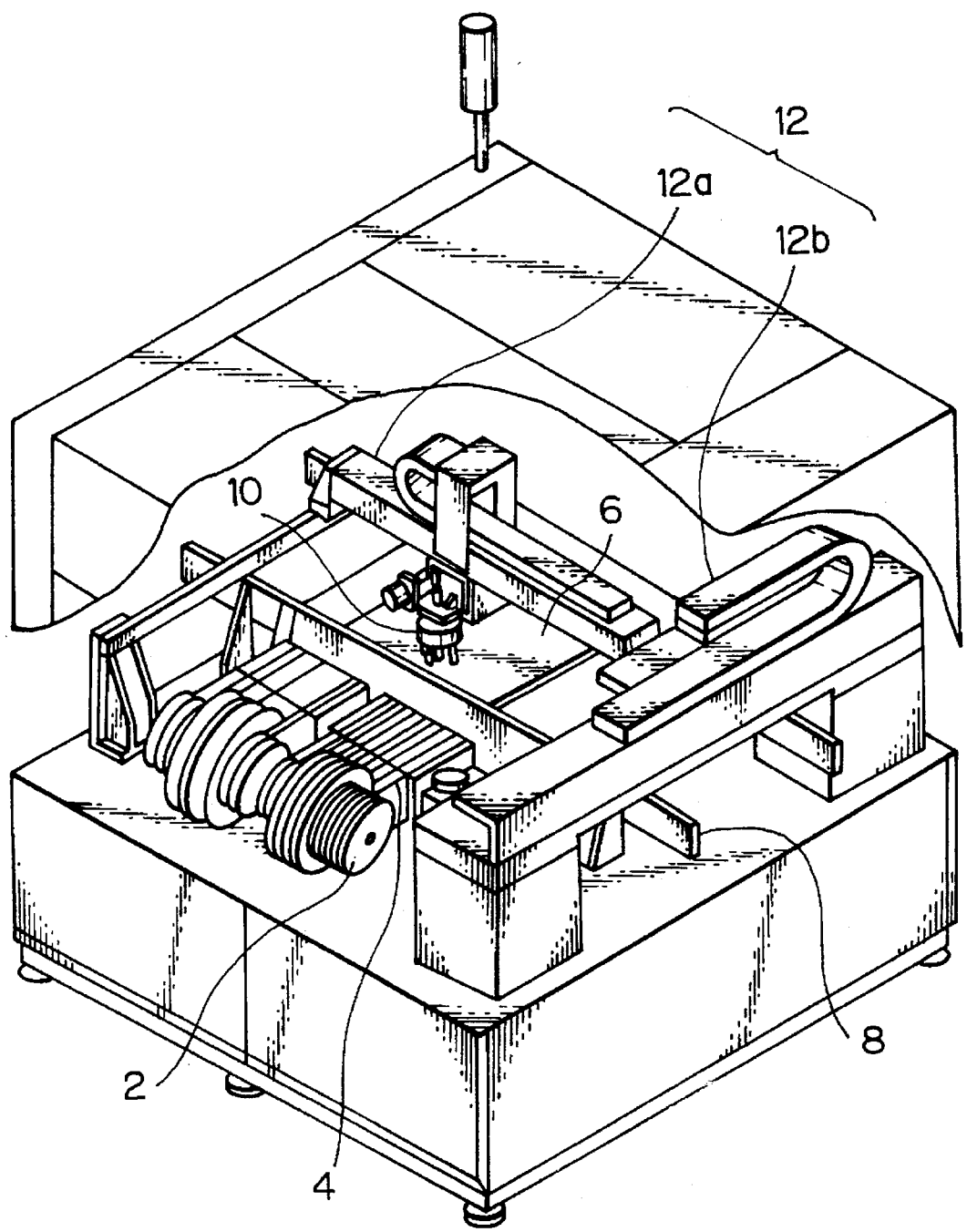
FIG. 7 is a schematic perspective view of a typical prior art chip mounter.
Figure 8:
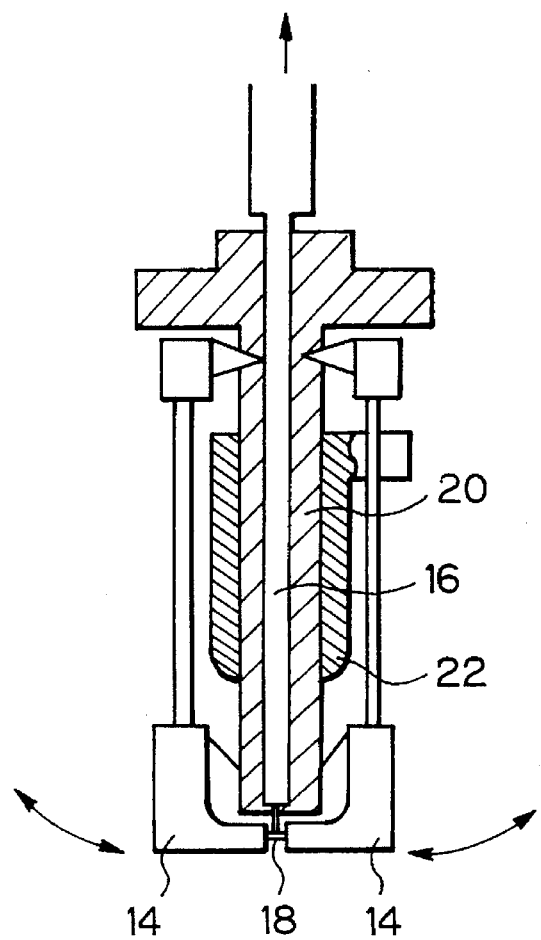
FIG. 8 is a schematic sectional view showing a prior art parts absorbing-mounting head device.
Figure 9:
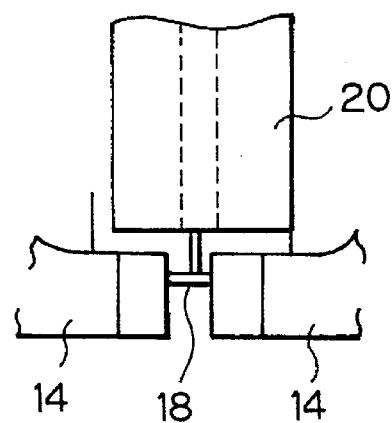
FIG. 9 is a view showing the discrepancy in the device of FIG. 8.

FIG. 3 shows the condition when the parts 18 is absorbed from a parts supply unit 4 (refer to FIG. 7) by the nozzle 26 of the tip end of the spindle 24. Firstly, the vertical drive motor 42 is actuated so that the spindle 24 is moved downward through the spindle retaining member 32. At that time, the locator retaining member 78 displaces downward by the spring force of the first spring member 80, and the supporting portion 78c on the lower end engages with the stop 81A of the guide rod 81, so that the stepped portion 24A of the spindle 24 separates from shoulder portion 78A of the locator retaining member 78. Further, due to the spring force of the second spring members 100A and 100B, the outer and inner cylindrical sliding members 90 and 92 move downward, and when the flange portions 102a of the rods 102 abut with respective flange portions 46d of the rotation retaining member 46 to act as stops, further downward movement is prevented.

The rollers 88 of the locators 82A and 82B move along the guide portions 94 of respective flange portions 90a and 92a and in the direction of the center of the spindle, such that the fulcrum portions 84 acting respectively as force transmitting portions to the locators take positional relationships separating from the guide portions 94 in the vertical direction, thus, the locators 82A and 82B take open positions. At that condition, the spindle 24 takes the lowermost position, and the parts 18 is absorbed on the tip end nozzle 26 of the spindle 24.

At the condition shown in FIG. 3, the vertical drive motor 42 is rotated in the reverse direction, and the spindle 24 is moved upward. The engaging stepped portion 24A of the spindle 24 engages with the shoulder portion 78A of the locator retaining member 78, which condition is shown in FIG. 4. When the vertical drive motor 42 is further rotated, the spindle 24 elevates further by a predetermined amount. FIG. 5 shows such condition.

When the spindle 24 further moves upward from the condition of FIG. 5, the engaging stepped portion 24A of the spindle 24 pushes up the shoulder portion 78A of the locator retaining member 78 against the spring force of the first spring 80. During the process of the upward movement, respective fulcrum portions 84 of the locators 82A and 82B move upward, while respective roller portions 88 are retained at same level in the vertical directions by the spring force of the second springs 100A and 100B (it will be noted that the roller portions 88 move in the horizontal direction), thus the locators 82A and 82B move pivotally and slowly in the closing directions.

When the spindle 24 moves upward to a predetermined position, the pawl portions 86A and 86B, together with pawl portions arranged in the direction perpendicularly intersecting with the pawl portions 86A and 86B, the parts 18 is clamped at four sides such that the parts 18 is aligned with the axis of the spindle 24, whereby the attitude of the parts 18 is controlled.

Incidentally, when the size of the parts 18 is large, the position of the locators 82A and 82B are adjusted with the pawl portions 86A and 86B contacting with the parts 18 in the closing condition of the locators, as shown in FIG. 1. At the condition with the pivotal movement of the locators 82A and 82B being stopped by engaging with the parts 18, the upper end flange portion 102a of the shaft 102 separates from the flange portion 46d of the rotation retaining member 46 and moves upward, thereby the outer and inner cylindrical slide members 90 and 92 move upward against the spring force of the second spring members 100A and 100B. Thus, the positional adjustment is performed depending on the size of the parts being handled. A locator rotator includes members 90, 92 and springs 100A, 100B.

After the positional adjustment has been performed, or simultaneously with the positional adjustment, the head device is displaced above the substrate by means of XY driving mechanism 12 (refer to FIG. 7) and, if necessary, actuates the rotary drive motor 74 to rotate the spindle 24 for rotating the spindle 24, together with the rotation retaining member 46, by a predetermined angle so as to locate angularly the device relative to the parts 18.

As described, the positional adjustment of the parts 18 is performed, by providing the first spring member 80 for displacing downward the fulcrum portions 84 of the locators 82A and 82B thereby opening the locators 82A and 82B, and the second spring members 100A and 100B for displacing downward the roller portions 88 of the locators 82A and 82B thereby closing the locators 82A and 82B, with the spring force of the first spring acting in the direction opening the locators 82A and 82B and in the direction against the upward movement of the spindle 24, and the spring force of the second springs 100A and 100B acting in the direction closing the locators 82A and 82B.

The two pairs (four) of locators rotate together with the spindle 24 through ball-spline nuts 76, thus, the positional dislocation can be prevented even at the angle other than 0 degree, 90 degrees, 180 degrees and 270 degrees, thus it is possible to minimize the loss in time.

Each of the second spring members 100A and 100B acting in the closing direction of the locators acts on a pair of opposing locators, thus, even if the spring force of the spring changes due to the elapse of time, the parts can be reliably centered.

The opening/closing of the locators is performed by the driving force of the drive motor 42 for vertically moving the spindle 24, thus, it possible to omit the locator opening/closing actuator in the prior art device, thus it is possible to reduce the weight and, since the locating operation is performed during the vertical movement of the spindle 24, it is possible to minimize the loss time for the positional location, and to attain a high speed operation.

In the embodiment, motors 42 and 74 are electric motors, but other actuator means such as a solenoid, air cylinder and the like can be substituted.

The rack and pinion and a timing belt 70 are utilized in the embodiment for transmitting the driving force from the motors 42 and 74, but they may be substituted by such as a gear, a chain, friction transmitting means and the like.

Further, a spline nut is utilized for transmitting the rotation to the spindle 24, but other means such as a key and a key groove, a rotation preventing pin and the like.

As described heretofore, the electronic parts mounting device according to the present invention attains the following advantages.

The locators are opened and closed by the force displacing the spindle in the vertical directions, thus, it is possible to omit actuators for opening/closing the locators in prior art devices, which enables to reduce the weight of the device.

Thus, it is possible to increase the operation speed. Further, the opening/closing of the locators or the locating operation of the parts is performed in response to the upward/downward movement of the spindle, thus, it is possible to minimize the parts locating time, and to increase actuating speed.

The locators rotate together with the spindle, thus, it is possible to prevent the dislocation of the parts even though the parts are located at an angle. Further, it is possible to perform simultaneously the positional location and the angular location, thus, high operation speed can be attained.

Further, a single spring acts on a pair of locators to urge them in the closing directions, thus, even though the spring force changes due to the elapsed time, the parts receive the same force in diametrically opposite directions, and the parts can be located at the axis of the spindle.

What is claimed is:

1. An electronic parts mounting device including a head movable along an upper surface of a substrate in X-axis and Y-axis directions for arranging electronic parts at predetermined locations on the substrate, the device comprising:

a frame for the head;

a spindle mounted on the frame, being rotatable and movable in the vertical direction with an upper end being connected to a source of vacuum and a lower end having a nozzle for absorbing the electronic parts;

a rotation retainer arranged around a circumference of the spindle and rotatable relative to the frame, and connected to the spindle, said rotation retainer being axially movable and rotationally fixed relative to the spindle;

a locator retainer for supporting at least one pair of locators with lower ends opposing a tip end of the nozzle, said at least one pair of locators able to clamp and retain the electronic parts absorbed by the nozzle, said locator retainer supporting said at least one pair of locators rotatably around a horizontal axis of said locator retainer, said locator retainer connected to the spindle and being axially movable and rotationally fixed relative to the spindle, and said locator retainer being vertically movable relative to the rotation retainer; and a locator rotator provided on the locator retainer for rotating said at least one pair of locators so as to close said at least one pair of locators when said at least one pair of locators and the nozzle are at the same level, said locator rotator having vertical movement members engaging said rotation retainer for vertical movement along a predetermined distance, said vertical movement members also engaging said locator retainer for vertical movement, said locator rotator also having springs elastically pushing said vertical movement members toward said rotation retainer, wherein, said at least one pair of locators and the vertical movement members cooperate to open and close said at least one pair of locators in response to vertical movements of the locator retainer relative to the vertical movement members, and wherein said springs allow the vertical movement members to rise by said predetermined distance after said at least one pair of locators clamp one of the electronic parts.

2. An electronic parts mounting device including a head movable along an upper surface of a substrate in X-axis and Y-axis directions for arranging electronic parts at predetermined locations on the substrate, the device comprising:

a frame for the head;

a spindle mounted on the frame and vertically movable with an upper end connected to a source of vacuum and a lower end having a nozzle for absorbing the electronic parts;

at least one pair of locators with lower ends opposing a tip end of the nozzle, said at least one pair of locators able to clamp and retain the electronic parts absorbed by the nozzle;

a locator retainer for supporting said at least one pair of locators rotatably around a horizontal axis of said locator retainer, said locator retainer connected to the spindle and being axially movable relative to the spindle, and said locator retainer connected to the frame and being vertically movable;

connecting means acting on the locator retainer to follow the upward movement of the spindle until the lower ends of the nozzle and said at least one pair of locators are located at the same level;

rollers at upper ends of said at least one pair of locators and rotatable around an axis parallel to a rotational axis of said at least one pair of locators; and a guide supported on the frame and able to move vertically by a pre-determined distance and located radially outside the spindle to engage with the rollers such that when the locator retainer is moved upward said at least one pair of locators are rotated around the rotational axis, said guide being moved upward together with the spindle when the spindle is moved further upward after said at least one pair of locators clamp one of the electronic parts; and springs elastically pushing said guide toward said frame, wherein, said at least one pair of locators and the guide cooperate to open and close said at least one pair of locators in response to vertical movements of the locator retainer relative to the guide, and wherein the springs allow the guide to move by the predetermined distance after said at least one pair of locators clamp the one electronic part.

3. An electronic parts mounting device including a head movable along an upper surface of a substrate in X-axis and Y-axis directions for arranging electronic parts at predetermined locations on the substrate, the device comprising:

a frame for the head;

a spindle rotatably mounted on the frame and vertically movable with an upper end connected to a source of vacuum and a lower end having a nozzle for absorbing the electronic parts;

a rotation retainer arranged around a circumference of the spindle and rotatable relative to the frame, and connected to the spindle, said rotation retainer being axially movable and rotationally fixed relative to the spindle;

at least one pair of locators with lower ends opposing a tip end of the nozzle, said at least one pair of locators able to clamp and retain the electronic parts absorbed by the nozzle;

a locator retainer for supporting said at least one pair of locators rotatably around a horizontal axis of said locator retainer, said locator retainer connected to the spindle and being axially movable and rotationally fixed relative to the spindle, and said locator retainer being vertically movable relative to the rotation retainer;

connecting means acting on the locator retainer to follow the upward movement of the spindle during the upward movement of the spindle until the lower ends of the nozzle and said at least one pair of locators are located at the same level;

rollers at upper ends of said at least one pair of locators and rotatable around an axis parallel to a rotational axis of said at least one pair of locators; and a guide supported on the rotation retainer and able to move vertically by a predetermined distance and radially outside the spindle to engage with the rollers such that when the locator retainer is moved upward said at least one pair of locators are rotated around the rotational axis.

* * * * *